United States Patent [19]
Tran

[11] Patent Number: 5,200,907
[45] Date of Patent: Apr. 6, 1993

[54] TRANSMISSION GATE LOGIC DESIGN METHOD

[76] Inventor: Dzung J. Tran, 7353 SE. Hacienda, Hillsboro, Oreg. 97123

[21] Appl. No.: 510,114

[22] Filed: Apr. 16, 1990

[51] Int. Cl.⁵ .................. G06F 7/48; H03K 17/687
[52] U.S. Cl. ................... 364/490; 364/488; 364/786; 307/448; 307/576
[58] Field of Search ............ 364/488, 489, 490, 491, 364/736, 754, 756, 757, 784, 786; 307/443, 448, 451, 480, 481, 576

[56] References Cited
U.S. PATENT DOCUMENTS

| | | | |
|---|---|---|---|
| 3,783,307 | 1/1974 | Breuer | 307/244 |
| 4,363,107 | 12/1982 | Ohhashi et al. | 364/758 |
| 4,536,855 | 8/1985 | Morton | 364/786 |
| 4,566,064 | 1/1986 | Whitaker | 364/300 |
| 4,710,649 | 12/1987 | Lewis | 307/451 |
| 4,736,119 | 4/1988 | Chen et al. | 307/269 |
| 4,815,003 | 3/1989 | Putatunda et al. | 364/491 |
| 5,036,215 | 7/1991 | Masleid et al. | 307/243 |
| 5,040,139 | 8/1991 | Tran | 364/760 |

OTHER PUBLICATIONS

H. Hnatek, *User's Guidebook To Digital CMOS Circuits* (McGraw-Hill 1981) pp. 34–41.
R. R. Shively, et al., "Cascading Transmission Gates to Enhance Multiplier Performance" *IEEE Transactions on Computers*, vol. C–33, No. 7, Jul., 1984.
K. Yano, et al., "A 3.8 ns 16×16 Multiplier Using Complementary Pass Transistor Logic" IEEE 1989 Custom Integrated Circuits Conference.

Primary Examiner—Vincent N. Trans
Attorney, Agent, or Firm—Marger, Johnson, McCollom & Stolowitz

[57] ABSTRACT

A method of designing a logic circuit for implementing a predetermined boolean function defines a binary tree structure formed of transmission gate multiplexer (TGM) circuits. The TGM tree structure includes one binary stage for each input variable. A resulting logic circuit design is reduced by one or more stages to improve performance by employing selected boolean functions of the most significant bits of the input variables as input signals to a reduced tree structure. The method is applicable circuit design in all MOS-type technologies including NMOS, PMOS, CMOS, BiMOS, FET and the like.

16 Claims, 11 Drawing Sheets

TRANSMISSION GATE LOGIC DESIGN METHOD

BACKGROUND OF THE INVENTION

This invention relates to the field of binary logic circuit design, and more particularly to methods of designing logic circuits for implementation in CMOS integrated circuit devices, or the like, that maximize circuit density while minimizing circuit delay.

Every designer and manufacturer of integrated circuits currently faces two formidable obstacles to performance improvements. First, further increases in circuit density require design and implementation of submicron feature size devices This effort requires vast investments of resources in new equipment and techniques. Second, even assuming success in building submicron devices, operation of circuits with transistor gate lengths substantially smaller than one micron is limited by breakdown voltages less than the five volt supply voltage level now standard for virtually all logic devices throughout the industry. Lower supply voltages compromise noise immunity and are incompatible with existing components and systems. Substantial investment in research, development and implementation of new processes and materials is being made in an attempt to overcome these limitations.

Such changes are likely to come about relatively slowly. In the interim, improved performance must be achieved by improved designs using existing technologies. Improvements in performance of some kinds of logic circuits have been achieved through the use of pass transistors or transmission gate structures. However, design of logic circuits using such technologies, particularly design of higher order logic functions (for example, functions of greater than three variables) remains a challenge. Optimizing such circuits to maximize density and performance has been achieved largely through trial and error and intuition developed by those skilled in the art. This kind of subjective circuit design approach, however, is very limiting and cannot be automated for computer-assisted design.

U.S. Pat. No. 4,710,649 (Lewis) discloses transmission gate logic circuits for implementing fundamental boolean combinations such as AND and OR functions. The '649 patent shows simplified or reduced versions of two and three input AND and OR gates for reducing transistor count, and suggests cascading additional stages to form a circuitry for implementing higher order functions. (See the discussion of FIG. 3, below.) However, there is no disclosure of a systematic way to simplify or reduce transmission gate logic circuits generally. The '649 patent makes no suggestion of how to approach design of a high order boolean function using transmission gate logic circuits.

U.S. Pat. No. 4,566,064 (Whitaker) presents a design methodology for constructing circuits using pass transistors to implement logic functions. The method disclosed in the '064 patent, however, has several drawbacks. First, in circuits designed in accordance with the '064 method, a substantial propagation delay results from connecting more than two transmission gate outputs in parallel. This results in larger output parasitic capacitants, a major contributor to delay in CMOS designs.

Second, the '064 patent does not suggest how to reduce a resulting design. Therefore, for a large number of inputs, the number of required circuit elements, such as transmission gates, increases geometrically with the number of input variables. Finally, the method described in the '064 patent is difficult to simulate on existing gate-level simulation programs because two or more transmission gate output terminals can be ON in parallel, thus requiring the simulator software to resolve this apparent driver conflict by applying varied signal strengths.

A basic primer on CMOS transmission gates and their use is E. Hnatek, USER'S GUIDEBOOK TO DIGITAL CMOS INTEGRATED CIRCUITS (McGraw-Hill 1981) pp. 34-41. A combinational multiplier circuit that includes the use of transmission gates in an adder cell is shown in R.R. Shively, et al. "Cascading Transmission Gates to Enhance Multiplier Performance" IEEE Transactions on Computers, Vol. c-33, No. 7, Jul. 1984. Pass transistor logic is used in "A 3.8 ns 16×16 Multiplier Using Complementary Pass Transistor Logic," by K. Yano, et al, IEEE 1989 Custom Integrated Circuits Conference. None of these references suggests a systematic method for design of digital circuits using transmission gate logic.

The problem of digital signal propagation delay through a string of pass transistors is recognized, and a solution suggested, in U.S. Pat. No. 4,536,855 (Morton). An MOS binary multiplication cell circuit with reduced transistor count is shown in U.S. Pat. No. 4,363,107 (Ohhashi et al.). Ohhashi et al., however, does not disclose a method of designing circuits of the type shown.

Other references of interest are Carver Mead and Lynn Conway, "Introduction to VLSI Systems," Addison Wesley Publishing, Chapters 1, 3, 5 and 9, 1980, and Neil Wesle and Kamran Eshraghian, "Principles of CMOS VLSI Design," Addison Wesley Publishing, Chapters 2 and 5, 1985.

Accordingly, the need remains for a better method of designing and constructing logic circuits to gain improvements in speed and performance over the state of the art.

The object of the invention is to systematize the design and optimization of boolean logic circuitry implemented with transmission gate circuit elements.

SUMMARY OF THE INVENTION

The present invention provides a method of constructing a transmission gate logic circuit to provide a predetermined boolean function of N input variables. The resulting circuit design includes a K-stage transmission gate multiplexer (TGM) tree structure, where K is less than N by a predetermined integer number M. The method thus allows design flexibility in determining the number of stages.

The method calls for assigning to each input variable a respective binary weight, so that the N input variables define a series of bits (MSB : MSB-1 : MSB-2 . . . LSB) in order of binary significance. Next, a K-stage TGM tree structure is defined, formed of TGM circuits. The TGM tree structure includes $2^{n-1}$ TGM circuits in each stage n.

Each of the K least significant input variables and their complements, respectively, are coupled to the control terminals of respective stages of the tree structure. These are arranged in order of binary significance, the least significant input variable being coupled to control the first stage, so that each final stage input terminal corresponds to a unique state of the K least significant input variables.

For each state of the K least significant input variables, the predetermined boolean function is expressed as a corresponding function of the M most significant input variables. Finally, for each possible state of the K least significant input variables, the corresponding final stage input terminal is coupled to receive a respective logic signal defined by the corresponding function of the M most significant input variables.

In this manner, the least significant input variables control the TGM circuits, while the most significant input variables determine the binary inputs to the final stage of the TGM tree structure. The circuit design thus can be balanced to achieve a relatively "square" design, i.e. one combining minimum delay with minimum chip area.

Systematic procedures are described for determining a TGM circuit design for a predetermined boolean function, and for reducing the initial design to reduce the device count. The reduction methods result in circuit designs which are smaller and faster than those obtainable by trial and error or designer intuition.

The tree structure input circuitry can be reduced from a transmission gate to a single transistor where the input signal is a fixed logic level.

The foregoing and other objects, features and advantages of the invention will become more readily apparent from the following detailed description of a preferred embodiment which proceeds with reference to the drawings.

BRIEF DESCRIPTION OF THE TABLES

Figure 2:
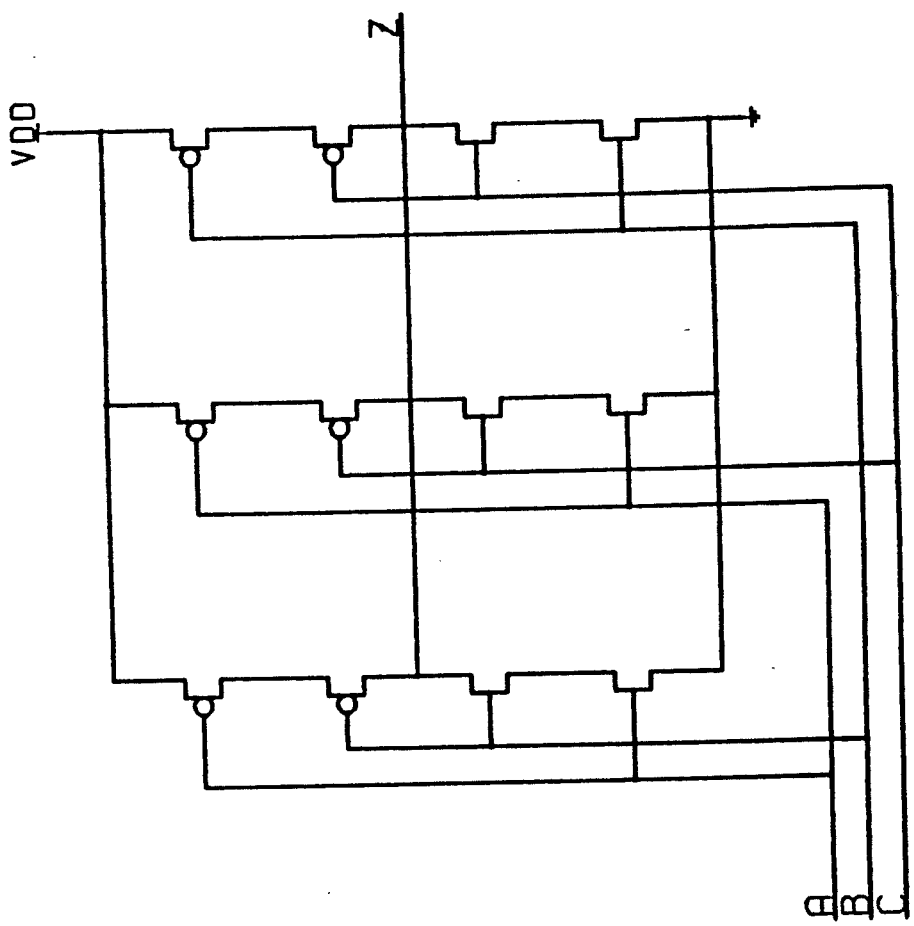
FIG. 2 is a conventional CMOS circuit design for implementing the logic function shown in FIG. 1.
Figure 3:
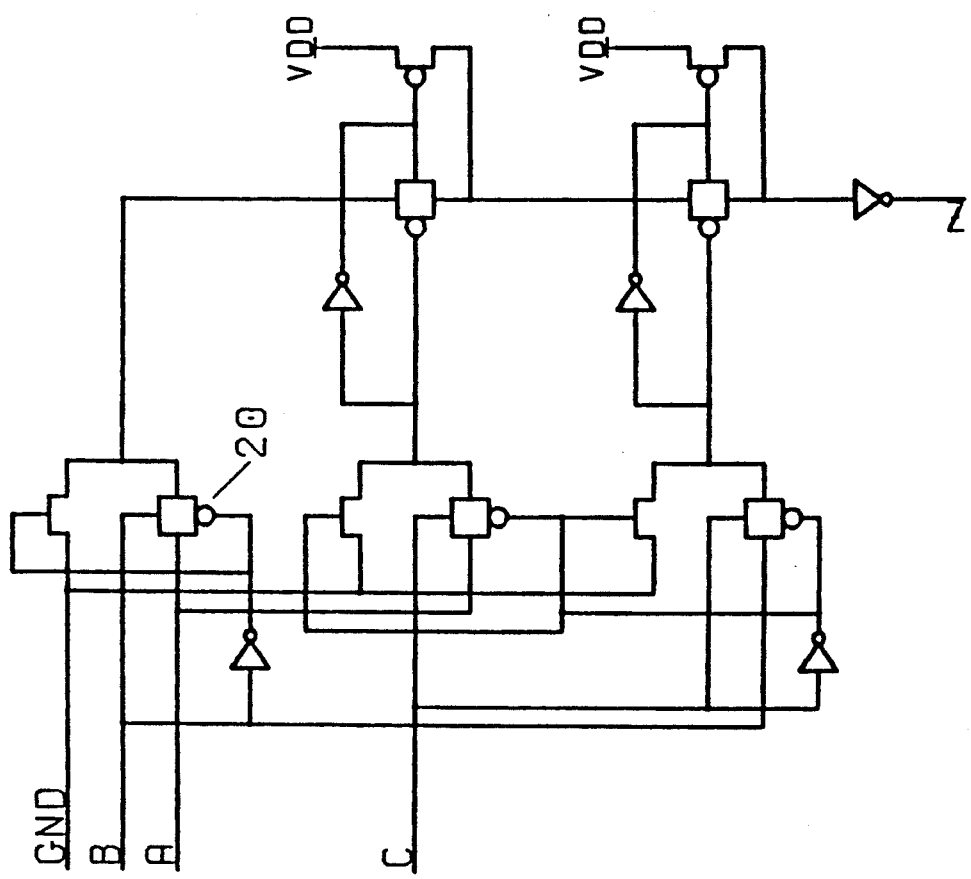
FIG. 3 is an alternative circuit design for implementing the logic function of FIG. 1.
Figure 4:
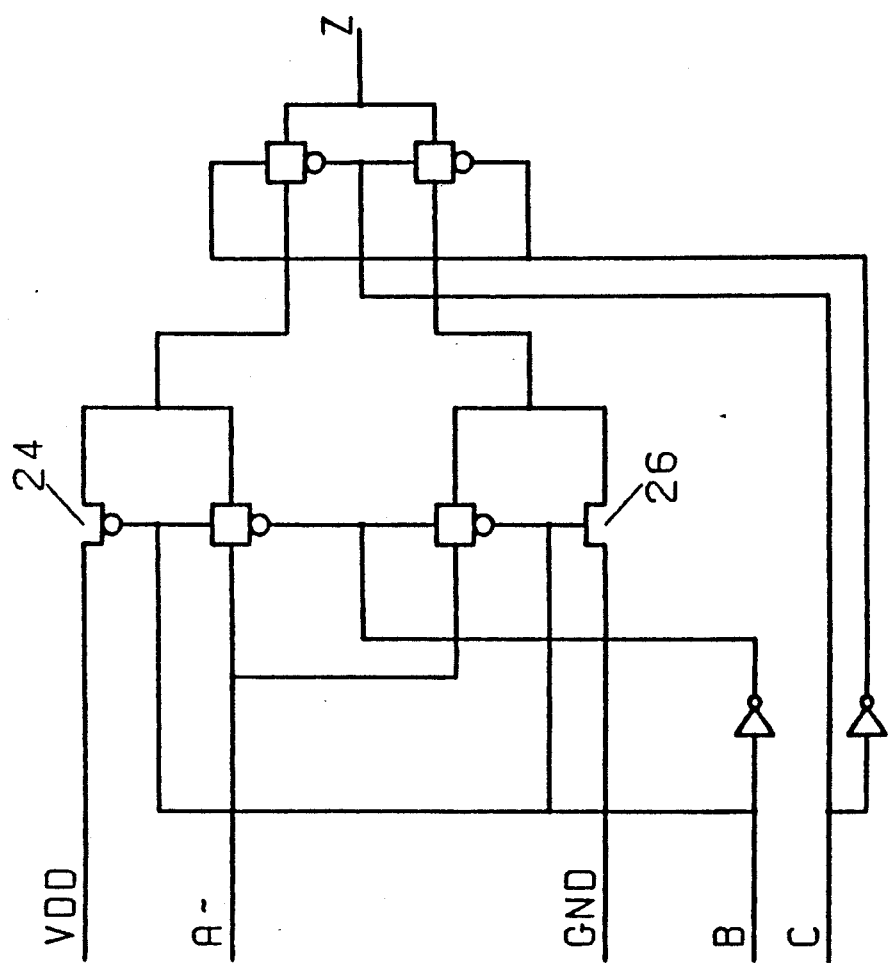
FIG. 4 is a reduced transmission gate multiplexer (TGM) circuit for implementing the logic function of FIG. 1 in accordance with the present invention.

Table 1 shows a comparison of device counts for the circuits of FIGS. 2–4.

Table 2 is a truth table for a Transmission Gate Multiplexer (TGM).

Table 3 is a truth table for a three-input AND-OR-INVERT function.

Table 4 relates the binary weighted inputs of the circuit of FIG. 8 to the msb input variable.

Table 5 shows substitution of a corresponding function of the msb for each binary weighted input of Table 4.

Table 6 relates the binary weighted inputs of the circuit of FIG. 8 to the msb and msb-1 input variables.

Table 7 shows substitution of a corresponding function of the msb and msb-1 for each binary weighted input of Table 6.

Table 8 relates the binary weighted inputs of a generalized TGM tree circuit having N stages to the most significant M of the input variables, for reducing the tree structure by M stages.

DETAILED DESCRIPTION

Introduction

Figure 1:
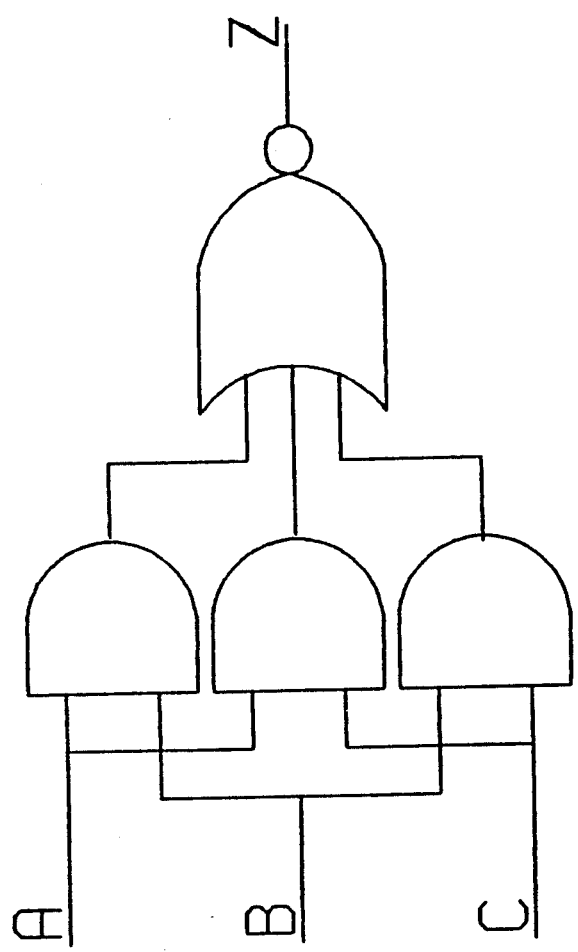
FIG. 1 is a symbolic logic representation of an AND-OR-INVERT function of three input variables.

The procedure and advantages of the design methodology described below may be illustrated by an example. FIG. 1 is a symbolic logic representation of an AND-OR INVERT function of three input variables A, B, and C. A conventional CMOS implementation of the logic function of FIG. 1 is shown in FIG. 2.

Another implementation of the logic function of FIG. 1 is shown in FIG. 3. FIG. 3 shows my design of an A-O-I circuit employing transmission gate elements, such as transmission gate 20, in accordance with the principles disclosed in U.S. Pat. No. 4,710,649 (Lewis).

FIG. 4 is a transmission gate multiplexer (TGM) circuit for implementing the logic function of FIG. 1 in accordance with the present invention. The transmission gate multiplexer (TGM) is further described below. The numbers of devices in these circuits are shown in Table 1:

TABLE 1

| DEVICE COUNT COMPARISON | | |
|---|---|---|
| FIG. Number | Transistors | Inverters |
| 2 | 12 | none |
| 3 | 15 | 7 |
| 4 | 10 | 2 |

The delay times for the circuits shown in FIGS. 2–4 are 1 ⅜, 2 ⅜, and 1 ⅜, respectively, expressed in NAND delay units. The transistor count and delay time for the novel circuit of FIG. 4 thus is less than either of the two known designs. Although the difference over conventional logic is not large in this simple example, the difference grows much larger for more complex circuits.

Transmission Gate Multiplexer (TGM) Tree Structures

Figure 5:
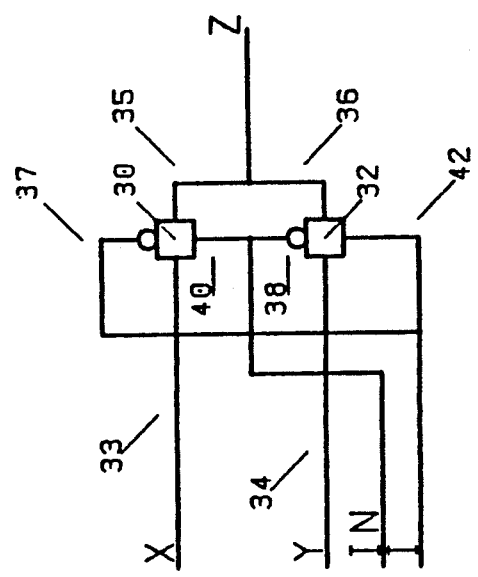
FIG. 5 is a schematic diagram of a known transmission gate multiplexer (TGM) circuit, which is used as a building block in the present invention.

FIG. 5 shows a pair of transmission gates 30,32 interconnected to form a transmission gate multiplexer (TGM). Each transmission gate is preferably formed by a pair of complementary PMOS and NMOS transistors having their respective sources and drains coupled together. Each of the transmission gates 30,32 includes, respectively, an input terminal 33,34 and an output terminal 35,36. A first input signal X is connected to the input terminal 33 of gate 30 and a second input signal Y is connected to the input terminal 34 of gate 32. The output terminals of the two transmission gates are coupled together to provide an output logic signal Z.

Each of the transmission gates 30,32 also includes first control terminals 37,38 and second (inverted) control terminals 40,42 respectively. Control terminals 37 and 42 are connected together to receive a single-bit binary variable or control logic signal I. Control terminals 40 and 38 are connected together to receive an inverted control signal IN, the complement of logic signal I. In operation, only one of the gates is enabled to transmit the signal at its input to the output at any one time. When I is high, gate 32 transmits input signal Y to the output Z and gate 30 is off. Conversely, when the control signal I is low, gate 30 transmits the input signal X to the output Z and gate 32 is off. The circuit of FIG. 5 thus provides a conventional multiplexer function, though it has the advantage afforded by the use of transmission gates, namely very short delay from input to output. The truth table for the transmission gate MUX circuit of FIG. 5 is shown below in Table 2.

TABLE 2

| TRUTH TABLE FOR TRANSMISSION GATE MUX (TGM) | | | | |
|---|---|---|---|---|
| I | IN | X | Y | Z |
| 1 | 0 | d | 1 | 1 |
| 1 | 0 | d | 0 | 0 |
| 0 | 1 | 1 | d | 1 |
| 0 | 1 | 0 | d | 0 |

Where d = don't care

Improved logic circuit designs may be synthesized in accordance with the invention by interconnecting a plurality of TGMs to form TGM tree structures. A one-stage TGM tree structure is defined as a TGM having one of the inputs connected to $V_{dd}$ and the other input connected to ground. The select inputs to the TGM are connected to an input variable (and its complement). A single variable logic function thus would require only one TGM.

Figure 6:
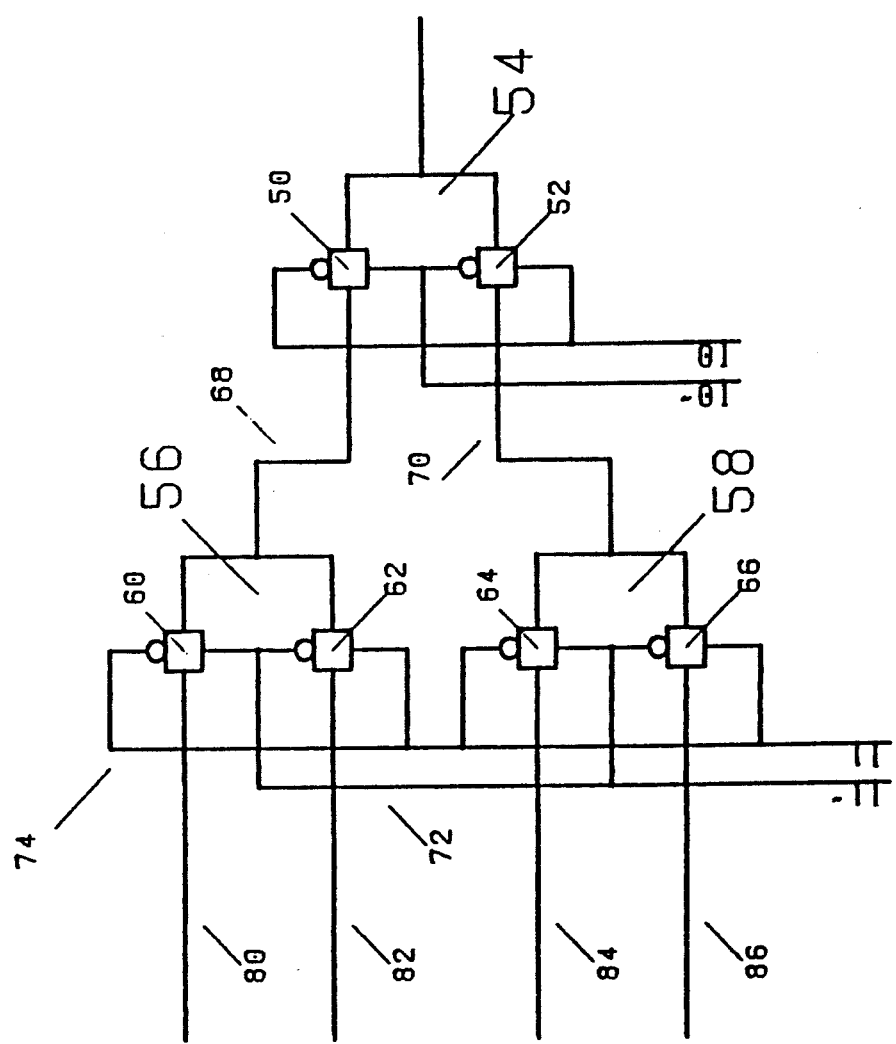
FIG. 6 is a schematic diagram of a generalized two-stage TGM tree structure according to the present invention.

A two-input variable logic function is implemented in a two-stage TGM tree structure as shown in FIG. 6. Referring to the right side of the figure, transmission gates 50,52 are interconnected as described above to form a first TGM 54. This first TGM forms the first stage of the two-stage TGM tree structure. Input variable logic signal $I_0$ and its complement $I_0'$ are coupled to the select inputs to control the first stage TGM. Input logic signal $I_0$ is selected to be the least significant input variable.

Referring to the left side of FIG. 6, gates 60 and 62 are interconnected to form a second TGM 56 and gates 64 and 66 similarly are interconnected to form a third TGM 58. The output of the second TGM is connected along path 68 to the input terminal to gate 50. Similarly, the output of the third TGM is connected along path 70 to the input to gate 52. The second and third TGMs form the second stage, in this case the final stage, of the TGM tree structure.

Input logic signal $I_0$ and its complement $I_0'$ are coupled to control the first stage TGM 54. Input logic signal $I_1$ and its complement $I_1'$ are connected along paths 74,72 respectively to control the second and third TGMs. Input logic signal $I_1$ is the most significant input variable, and $I_0$ is the least significant input variable. The resulting two-stage TGM tree structure has four input terminals 80, 82, 84 and 86, corresponding to the input terminals to the four gates that make up the final stage.

One of the four inputs is selected and routed through the two-stage TGM tree structure to the Z output in accordance with the logic states of the two input variables $I_1$ and $I_0$. For example, where $I_1$ is high and $I_0$ is low, transmission gates 62, 66, and 50 are on or enabled. As a result, the logic signal present at input terminal 82 will be routed to the Z output. The two-stage TGM tree structure thus functionally resembles a 4:1 multiplexer.

In this manner, any desired logic function of N input variables can be implemented in a circuit that comprises N stages of TGMs. Each stage includes $2^{N-1}$ TGM's where N is the stage number. In such a circuit, the first or least significant input variable will control only one TGM, the first stage of the tree structure. The second input variable will control two TGM's (the second stage), the third input variable will control four TGM's (the third stage), and so on. In general, the $N^{th}$ input variable will control $2^{N-1}$ TGM's.

Only the highest order stage has its inputs connected to $V_{dd}$ and ground. This stage is called the final stage of the TGM tree structure. All of the other stages have their other inputs connected to the outputs of the previous (i.e., next higher order) stage. See, for example, paths 68 and 70 in FIG. 6.

Figure 7:
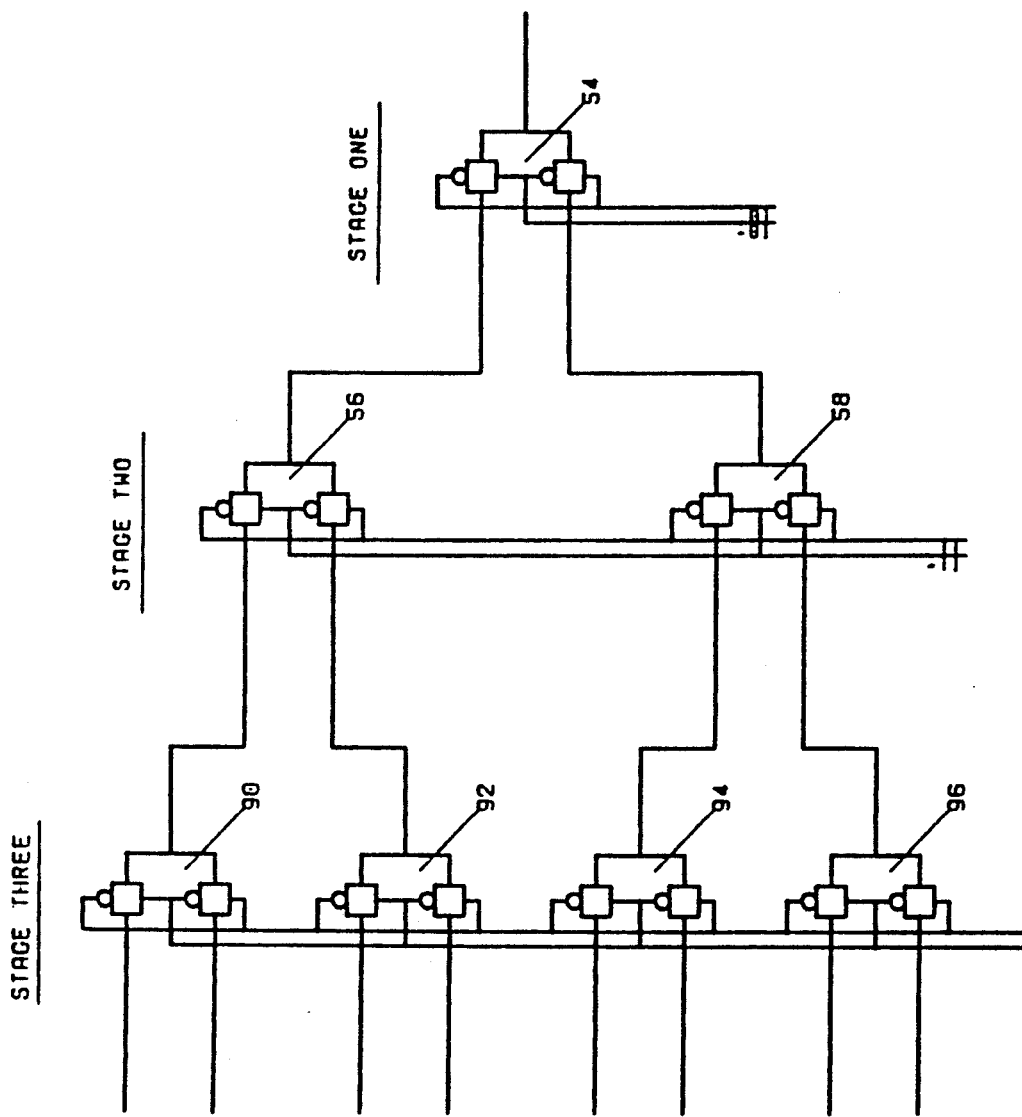
FIG. 7 is a schematic diagram of a generalized three-stage TGM tree structure according to the present invention.

A three-stage TGM tree structure is shown in FIG. 7. In addition to the first and second stages described above, this structure has a third stage comprising four TGMs 90, 92, 94 and 96.

Design Procedure For Synthesizing a Logic Function With TGM Logic

In general, any predetermined boolean function of any number of input variables can be synthesized using a TGM tree structure as follows. First, a TGM tree structure is defined, as described above, having a number of stages equal to the number of input variables. Second, the final stage inputs are coupled to $V_{dd}$ and ground in accordance with the predetermined boolean function. Optionally, the resulting circuit may be reduced in order to minimize circuit area and delay.

The step of defining the appropriate TGM tree structure has been described above. The next task is to select the input logic signals to the final stage of the defined TGM tree. Functionally, this task requires identifying each of the $2^N$ paths through the tree structure, from each final stage input terminal to the first stage output terminal. Each of these paths through the tree structure corresponds to a unique state of the input variables.

The procedure requires designating as a "false" path each path through the tree structure for which the desired boolean function is false, for the corresponding state of the input variables. Similarly, each path through the tree structure for which the corresponding boolean combination of the input variables is true, is designated as a "true" path. For each true path, a logical true signal, i.e., $V_{dd}$, is coupled to the corresponding input terminal to the final stage of the tree structure. Similarly, for each false path, a logical false signal, i.e. ground, is coupled to the corresponding input terminal to the final stage of the tree structure. Thus, in operation of the logic circuit, the logic states of the input variables control the TGM circuits to route a logic signal to the output terminal in accordance with the desired boolean function.

A systematic procedure, called "binary weighting," for identifying each path through the tree and associating each such path to the desired logic function is described below with reference to the following example.

FIG. 1 shows an AND-OR-INVERT function Z of three input variables. A truth table for this function is shown below in Table 3. In the table, all possible binary combinations or states of the input variables are listed in ascending order, where A is the most significant input variable and C is least significant.

TABLE 3

AND-OR-INVERT FUNCTION

| Input Variable | | | | |
|---|---|---|---|---|
| A | B | C | Z | W |
| 0 | 0 | 0 | 1 | $W_0$* |
| 0 | 0 | 1 | 1 | $W_1$* |
| 0 | 1 | 0 | 1 | $W_2$* |
| 0 | 1 | 1 | 0 | $W_3$ |
| 1 | 0 | 0 | 1 | $W_4$* |
| 1 | 0 | 1 | 0 | $W_5$ |
| 1 | 1 | 0 | 0 | $W_6$ |
| 1 | 1 | 1 | 0 | $W_7$ |

Figure 8A:
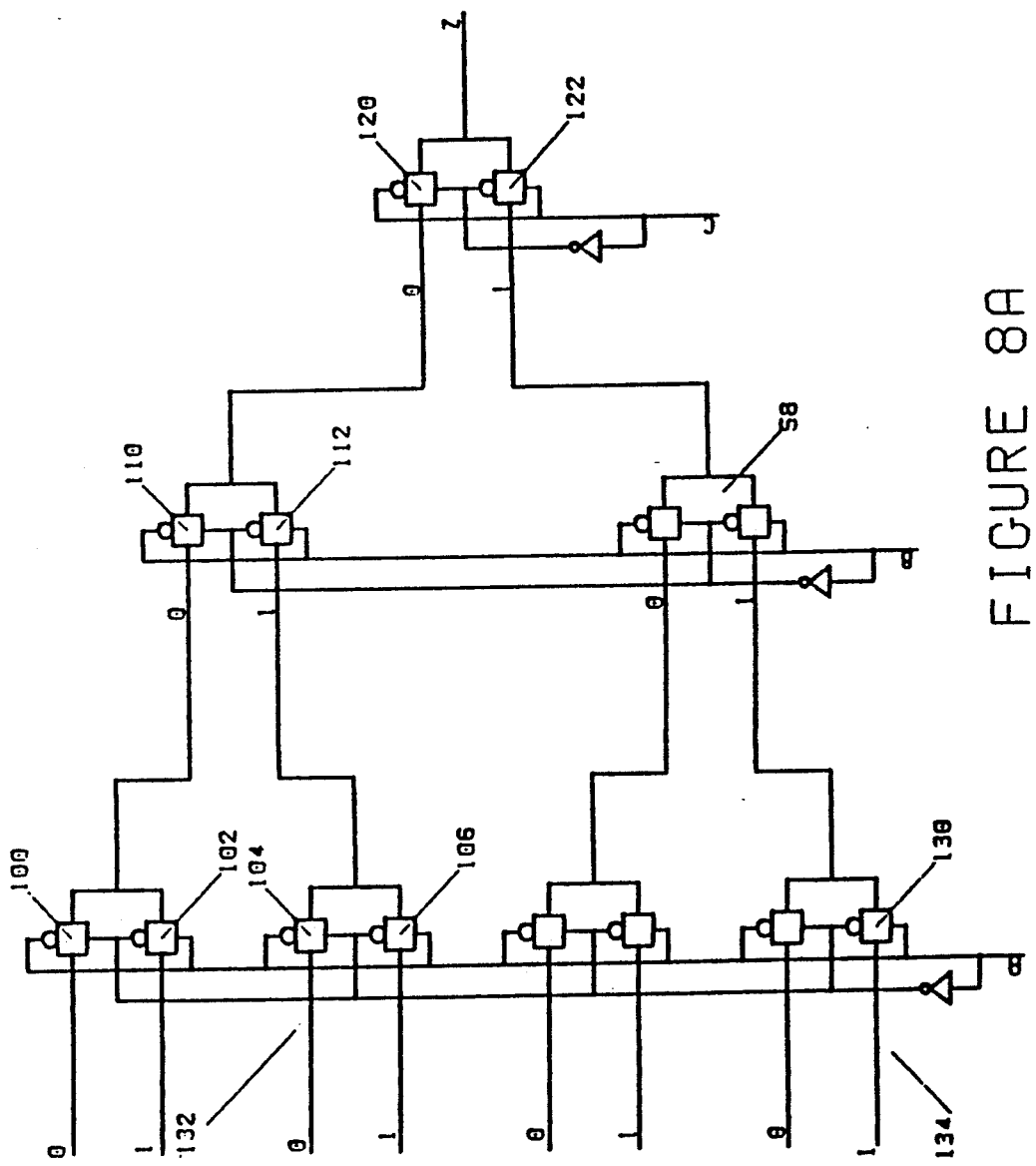
FIGS. 8A and 8B are three-stage TGM circuit diagrams showing the steps for implementing the logic function of FIG. 1 in accordance with the invention.

As there are three variables, a three-stage TGM tree structure will be used, as shown in FIG. 8A. The input logic signals A, B and C and their respective complements are coupled to control the TGMs as shown in FIG. 8A. Each input logic signal controls one stage of the TGM tree.

Binary Weighting Paths Through a TGM Tree

Identifying each path through the TGM tree structure and associating each such path to the desired logic function is accomplished by utilizing a binary weighting procedure. The binary weighting procedure calls for assigning a zero or a one to each input of each TGM throughout the binary tree structure, including the final stage TGM's. This step is based on the TGM truth table (Table 2), and is independent of the desired boolean function. The binary weight is used to link or equate the logic circuit structure to the truth table (Table 3) so as to determine the final stage inputs needed to produce the predetermined boolean output function Z. Each path through the TGM tree structure corresponds to a unique state of the series of input variables A, B, C, as does each row of the truth table. This correspondence can be used to determine the final stage inputs from the Z output.

To assign the binary weight, first assume a low or 0 input on the control input to a particular stage. A zero is assigned to the inputs to the gates that turn ON in response to that control input. Conversely, the inputs to the gates that turn OFF in response to that control input are assigned a one. (One could, of course, assume a high or 1 control input, and reverse the assignments.) If one input to a particular TGM is assigned a zero, the other input to the same TGM must be assigned a one, and vice versa.

To illustrate, FIG. 8A shows a three-stage tree structure with the addition of binary weighting numbers as follows. In stage 3, gates 100,102 form the first (top) TGM. When the corresponding control input A is low, gate 100 is ON, so the input to gate 100 is assigned a zero. When A is low, gate 102 is OFF, so the input to gate 102 is assigned a one. Gates 104,106 form the next TGM in stage 3. As this TGM has the same control input (A), its inputs are numbered in the same fashion. The same applies to the remaining two TGM's in stage 3.

Similarly, in stage 2, gates 110,112 form the first TGM. When control input B is low, gate 110 is ON, so the input to gate 110 is assigned a zero. The input to gate 112 is assigned a one. Inputs to the other TGM in stage 2 are similarly numbered. The two inputs to the single TGM (gates 120,122) of stage 1 are numbered 0,1 in like fashion.

After these binary weights (zero or one) have been assigned to each input throughout the tree, each path from the final stage (here stage 3) to the output (Z) defines a series of the assigned zeroes and ones. Each such series uniquely identifies the corresponding path. For example, referring to the path that begins at input 132 (the input to gate 104), the binary weights define the series 0-1-0 by tracing the path from left to right through the tree, i.e. from each gate input to the corresponding gate output. The path that corresponds to input 134 (the input to gate 130) defines the series 1-1-1. These series of bits each form the binary weight ($W_i$) of the corresponding input.

Implementing A Particular Boolean Function

Each path uniquely corresponds to one of the rows in the truth table (Table 3). To produce the predetermined Z output from fixed input logic signals (zero and one) transmitted through the tree, the fixed input signals are connected to the final stage input terminals in one-to-one correspondence with the binary Z-output column (Table 3).

Figure 8B:
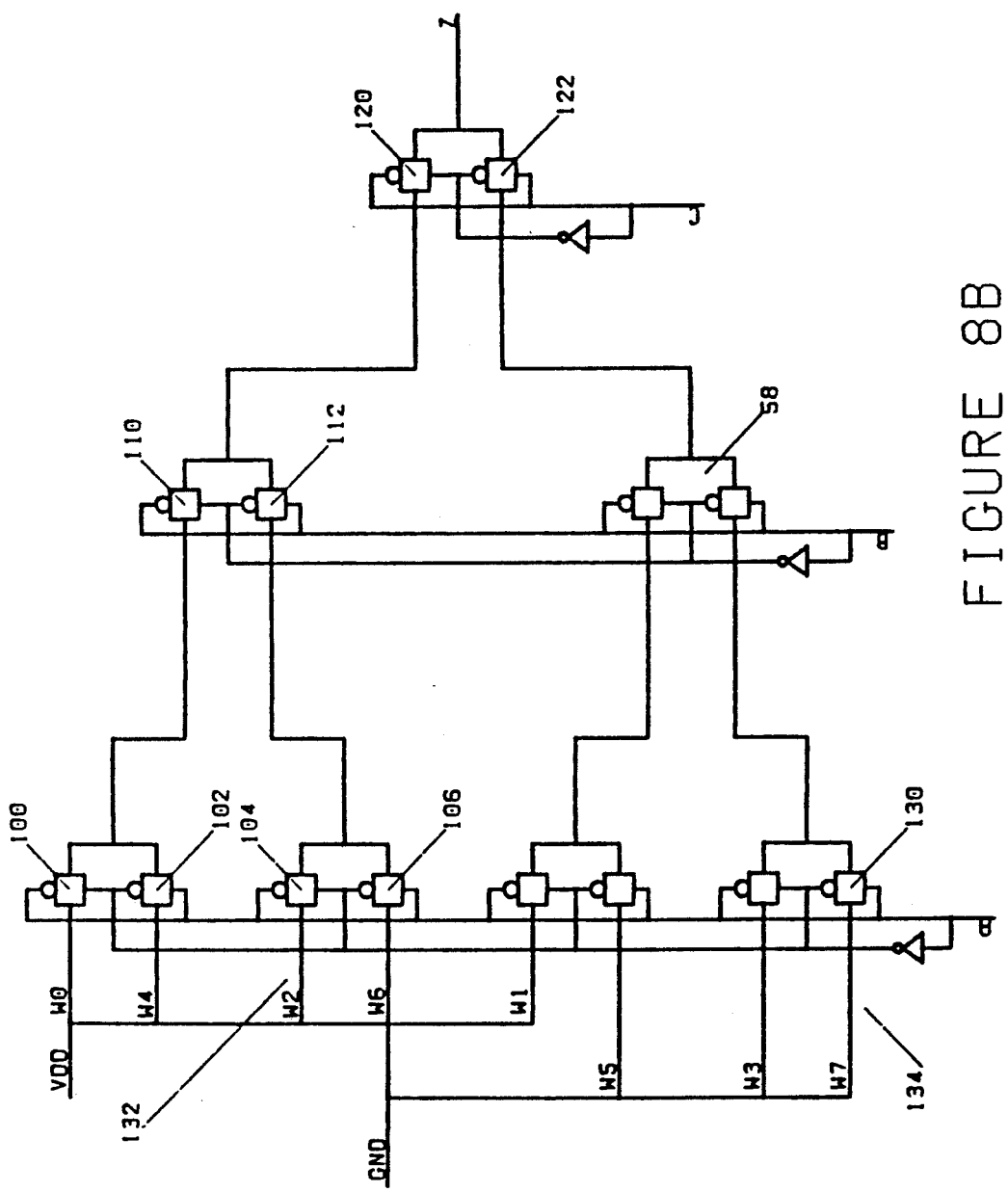

Referring to FIG. 8B, the binary weight of each input is translated to a decimal equivalent which is used to identify each final stage input. The decimal equivalent weight of input 132 thus is 2, the decimal value of the binary word 0-1-0. Input 132 therefore is labeled $W_2$. Similarly, input 134 is labeled $W_7$ (seven being the decimal value of binary 1-1-1). The assignment of a decimal equivalent binary weight $W_i$ will aid in understanding this relationship. More importantly, the binary weights $W_i$ can subsequently be used in reduction of the logic circuit.

Referring to Table 3, the three columns labeled A,B and C show the possible logic states of the respective input variables. A fourth column, labeled Z, shows the logic state of the output according to the predetermined function (here AND-OR-INVERT). A fifth column, labeled W, identifies each row as $W_i$, where i is the decimal equivalent weight of the corresponding tree input.

Each row in the table thus corresponds to a path through the tree. The value of each $W_i$ is the value of Z for the corresponding path. Thus, according to the table, the value of $W_2$ is one, the value of $W_7$ is zero, etc. The decimal equivalent weights that have a value of Z=1 are indicated by an asterisk in the table.

The next step, in a non-reduced design, is to connect each of the final stage inputs to either $V_{dd}$ or ground, according to the truth table for the Z-function (e.g., Table 3), as follows. For each row of the table, i.e. for each input $W_i$, if the corresponding Z output entry in the truth table is a one, then the input is coupled to $V_{dd}$ (regardless of whether a zero or a one was assigned to it when finding the binary weight of the path). Conversely, for each row in which the corresponding Z output entry in the truth table is a zero, the input is coupled to a logic zero or ground.

Accordingly, referring to FIG. 8B, inputs $W_0$ $W_4$ $W_2$ and $W_1$ are coupled to $V_{dd}$. Inputs $W_6$ $W_5$ $W_3$ and $W_7$ are coupled to logic zero or ground. In operation, this circuit will have an output signal Z that is the AND-OR-INVERT function of inputs A,B and C in accordance with Table 3. The circuit of FIG. 8B is functional but not optimal. It remains to reduce the size of the circuit to improve its performance.

Reducing The TGM Tree Structure

The number of stages of a TGM tree structure as above-described increases in direct proportion to the number of input variables. As a result, the number of devices, and hence the area of the circuit, increases geometrically. No binary tree structure should be allowed to grow beyond four stages, due to TGM delay and size considerations. What is needed is a procedure for reducing the number of stages without changing the logical function of the circuit.

In general, to reduce the number of stages, the most significant input variable (hereafter MSB) and the complement of MSB (MSB*) logic signals are selectively used as inputs to the final stage of a reduced tree structure, in addition to $V_{dd}$ and ground. When MSB and MSB* variables are so used, the final stage is eliminated, thereby reducing the circuit size approximately by one-half.

If Z is a function of N input variables, and the MSB input variable is used to replace some of the final tree inputs, then there will be two sets of binary weighted inputs, each input having a decimal equivalent weight in the range of zero to $2^{(N-1)}-1$. One set of inputs corresponds to the case of MSB true or equal to one. The other set corresponds to the opposite state, i.e. MSB* true. Conceptually, this bifurcation of terms based on the state of the MSB may be likened to splitting a Karnaugh map of an N variable function to form a pair of K-maps each having N−1 variables.

The procedure for reducing a three-stage circuit to a two-stage circuit is described using the three-stage circuit of FIG. 8B as an illustration. That circuit is reduced to a functionally equivalent two-stage circuit as follows. A new table is constructed, Table 4 below, consisting of two rows, one row corresponding to each logic state of the MSB.

TABLE 4

|    | $X_0$   | $X_1$   | $X_2$   | $X_3$ |
|----|---------|---------|---------|-------|
| A' | $W_0^*$ | $W_1^*$ | $W_2^*$ | $W_3$ |
| A  | $W_4^*$ | $W_5$   | $W_6$   | $W_7$ |

Inputs $W_0$ through $W_3$ correspond to the input states in which the MSB (input variable A) is false, so they are placed in the first row of the table, labeled A'(A-not). The second row is labeled A, as it corresponds to A true, and includes inputs $W_4$ through $W_7$. As above, the inputs that have an output value Z=1 are indicated by an adjacent asterisk.

Each column of the new table corresponds to a respective one of the inputs to the reduced tree structure. These are labeled $X_0$ through $X_3$. As the reduced tree structure has only two stages, it has only four inputs. Next, the "value" of each $W_i$ is determined as a function of MSB (input variable A), as follows:
1. Replace each $W_i$ in row 1 with A' if $W_i=1$ (indicated *)
2. Replace each $W_i$ in row 2 with A if $W_i=1$.
3. Replace all $W_i=0$ with 0.

The result is shown in Table 5A, below.

TABLE 5A

|    | $X_0$ | $X_1$ | $X_2$ | $X_3$ |
|----|-------|-------|-------|-------|
| A' | A'    | A'    | A'    | 0     |
| A  | A     | 0     | 0     | 0     |

Next, the resulting terms (A, A' or 0) within each column of Table 5 are logically OR-ed together. The OR step results in values 1:A':A':0 (recognizing that (A' OR A)=1), as shown in Table 5B.

TABLE 5B

|    | $X_0$ | $X_1$ | $X_2$ | $X_3$ |
|----|-------|-------|-------|-------|
| OR | 1     | A'    | A'    | 0     |

This step assembles all possible input states that are true according to the predetermined boolean function (here AND-OR-INVERT). It may be recalled that each input terminal has a corresponding path through the tree which, in turn, corresponds to a unique state of the input variables (here B and C). This logic OR step thus performs a function that is conceptually similar to that of the OR gate that appears at the output stage of a programmable array logic device for OR-ing together all of the product terms.

Figure 9:
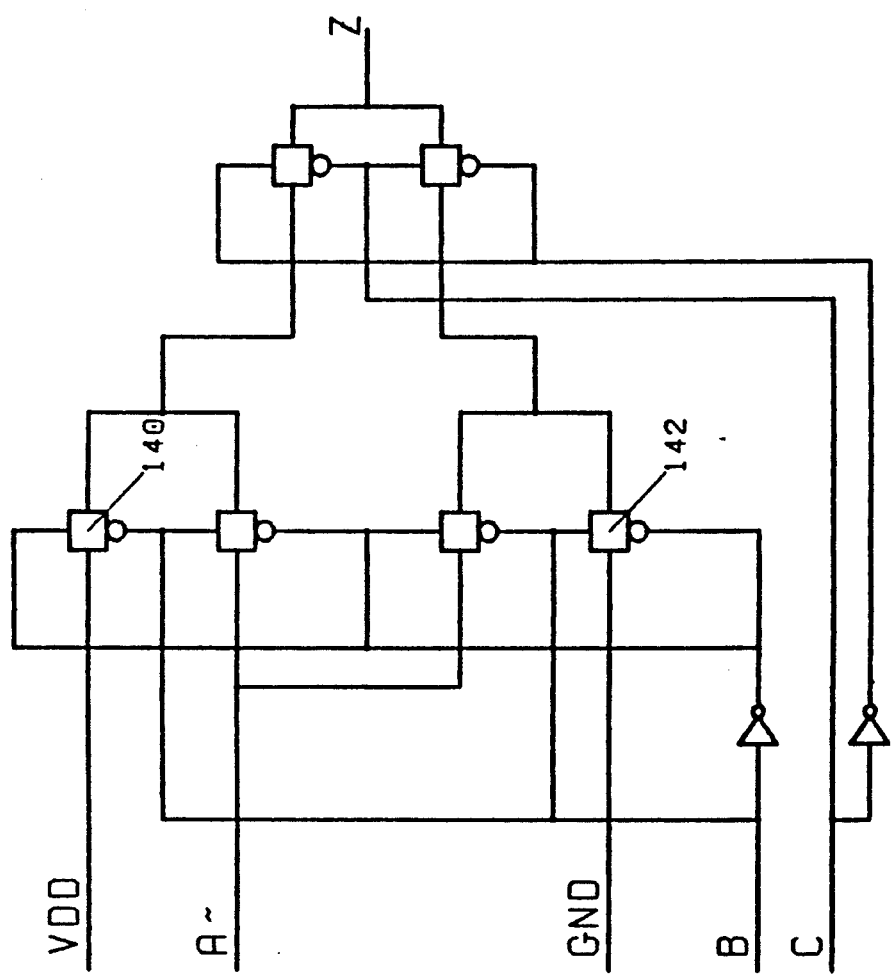
FIG. 9 is a reduced version of the TGM circuit of FIGS. 8A and 8B for implementing the logic function of FIG. 1 in accordance with the invention.

The inputs to the reduced tree structure are connected to receive logic signals having the indicated values: $X_0=1=$VDD $X_1=A'$ $X_2=A'$ $X_3=0=$GND. The resulting reduced circuit is shown in FIG. 9. The circuit of FIG. 9 is approximately one-half the size of the circuit of FIG. 8, while providing the same boolean function.

Reducing Input Device Count

Where an input terminal to the final stage of a TGM tree circuit is connected to a fixed logic level (ground or VDD), the circuit can be further simplified and the device count reduced by replacing the corresponding transmission gate by a single transistor. This is because an N-channel device alone is sufficient to conduct a ground signal and a P-channel device alone is sufficient to conduct a $V_{cc}$ signal. If the input signal is a variable, however, both P-channel and N-channel devices are needed.

To illustrate, in FIG. 9, the inputs to gates 140 and 142 are connected to $V_{cc}$ and ground, respectively. Gates 140,142 may be replaced by single transistors. The resulting circuit is that shown in FIG. 4, in which transistors 24,26 replace gates 140,142 (FIG. 9). This principle is applicable to any TGM circuit; for example, in FIG. 8B each of the final-stage gates could be reduced to a single gate by deleting the N-channel transistors having VDD as an input and deleting the P-channel devices having GND as an input.

Two-Stage Reduction of TGM Tree Circuits

Reduction of a TGM tree circuit by two stages is conceptually similar to reduction by one stage, described above. Two-stage reduction begins as before, by determining the value of each input $W_i$ for an N-stage implementation, where N is the total number of input variables. For the AND-OR-INVERT function of three variables, the input values are determined as above.

To reduce the circuit design by two stages (here to a single TGM stage), it is convenient to construct a table such as Table 6, having one row for each state of the two most input variables MSB, MSB-1 (here A and B).

TABLE 6

|    |    | $X_0$   | $X_1$   |
|----|----|---------|---------|
| A' | B' | $W_0^*$ | $W_1^*$ |
| A' | B  | $W_2^*$ | $W_3$   |
| A  | B' | $W_4^*$ | $W_5$   |
| A  | B  | $W_6$   | $W_7$   |

The rows in Table 6 reflect the possible logic states of variables A and B. Each column in the table corresponds to a respective one of the final stage inputs to the reduced tree structure. As the reduced or "target" design will have only one stage, it will have only two input variables, $X_0$ and $X_1$.

The $W_i$ inputs ($W_0$ through $W_7$) are arranged in Table 6 as shown. That is, the first two $W_i$ in the first row, the second two $W_i$ in the second row, etc. Inputs having a value $Z=1$ are designated by an asterisk, as before.

Next, the reduction procedure calls for determining the value of each $W_i$ as a function of A and B. This is done by the following steps:

Replace $W_i$'s in row 1 with A'B' for $W_i=1$.
Replace $W_i$'s in row 2 with A'B for $W_i=1$.
Replace $W_i$'s in row 3 with AB' for $W_i=1$.
Replace $W_i$'s in row 4 with AB for $W_i=1$.
Replace $W_i$'s in all rows with 0 for $W_i=0$.

The result is shown in Table 7, below.

TABLE 7

| $X_0$ | $X_1$ |
|---|---|
| A' B' | A' B' |
| A' B | 0 |
| A B' | 0 |
| 0 | 0 |

Figure 10:
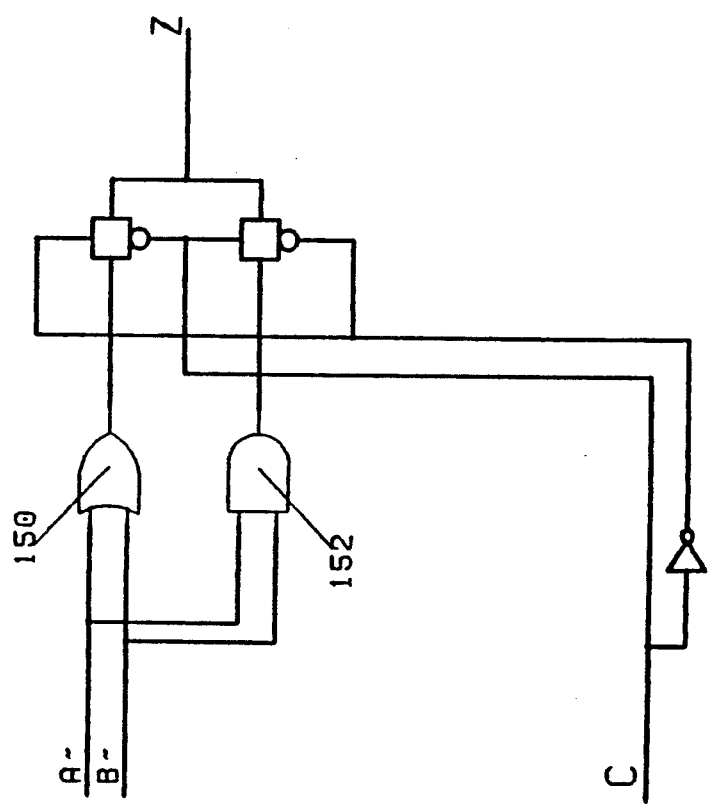
FIG. 10 is a further reduced TGM circuit for implementing the logic function of FIG. 1.

Next, the resulting terms within each column of Table 7 are logic OR-ed together to define, for each input to the reduced tree structure, a corresponding function of A and B: $X_0=(A'B'+A'B+AB'+0)$. This expression reduces to $X_0=A'+B'$. $X_1=(A'B'+0+0+0)$; therefore $I_1=A'B'$. The resulting circuit design is shown in FIG. 10. Implementation of the logic functions AND 150 and OR 152 is known.

General Case Reduction by M Stages

The foregoing reduction procedures can be extended to the general case, as described next. Assume a predetermined boolean function of N input variables. A truth table, like Table 3, is constructed to determine the values, zero or one, of each of a corresponding set of $2^N$ binary weighted inputs or their respective decimal equivalents $W_i$. The resulting circuit will be a TGM tree structure having N stages and $2^N$ inputs.

To reduce the N-stage TGM tree structure by M stages (whereby $M<N$), thereby reducing the circuit size by approximately $2^M$, a second table is constructed having one row for each possible logic state of input variables MSB through MSB-(M−1), for a total of $2^M$ rows. For example, to reduce the N-stage circuit by 3 stages, the table would include 8 rows, one row for each state of logic variables MSB, MSB−1 and MSB-2.

Referring to Table 8, the M most significant input variables are designated $I_0$ through $I_M$. False logic states are designated by a prime ('). Accordingly, the second row in Table 8, for example, corresponds to a state in which $I_0$ is true, and $I_1$ through $I_M$ are false.

TABLE 8

| M VARIABLES | | | | K VARIABLES |
|---|---|---|---|---|
| | W0' | W1' | ... | W(2 (K) − 1) |
| IM'...I2'I1'I0' | W0 | W1 | ... | W(2 (K) − 1) |
| IM'...I2'I1'I0 | W(2 K) | W(2 K) + 1 | ... | W(2 (K + 1) − 1) |
| ... ... ... | ... | ... | ... | ... |
| IM...I2 I1 I0 | W[(2 N) − 1]*[2 (K)] | | ... | W(2 M) − 1 |

The reduced TGM tree structure will have K stages, where $K=N-M$. Therefore, the reduced structure will have $2^K$ inputs, designated $W_0$ through $W(2^K)-1$. Each column in Table 8 corresponds to a respective one of the inputs to the target reduced tree structure. The $2^N$ binary weighted inputs $W_i$ are arranged in the table as follows. The first $2^K$ inputs are placed in the first row. The second $2^K$ inputs are placed in the second row, etc. $2^M$ rows times $2^K$ columns $=2^N$ $W_i$'s.

Next, the value of each $W_i$ is determined as a function of input variables MSB through MSB-(N−1), i.e., $I_N$..$I_0$, as follows. In the first row, the $W_i$'s are replaced with $I_M'$...$I_2'I_1'$ $I_0'$ for $W_i=1$. In the second row, the $W_i$'s are replaced with $I_M'$...$I_2'$ $I_1'$ $I_0$ for $W_i=1$, and so on, the $W_i$'s in the last row being replaced with $I_M$...$I_2 I_1 I_0$ for $W_i=1$. All $W_i$'s=0 are replaced with zeros.

Next, the resulting terms within each column in the table are logic OR-ed together to form a respective input function, i.e. a logic signal defined as a function of the input variables $I_0$ through $I_M$, for input to the corresponding final stage input to the K-stage reduced tree structure. For M greater than two or three, each input function may itself be implemented using a TGM tree circuit as described herein. Further, each such input circuit may be reduced as just described.

In larger circuits, an active driver such as a conventional inverter is employed after each four TGM stages in a typical case. The need for and details of such drivers will depend upon the specific application, and are known to those skilled in the art.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A method of constructing a transmission gate logic circuit for providing a predetermined boolean function of N input variables, comprising:

providing an N-stage transmission gate multiplexer (TGM) binary tree structure formed of TGM circuits and including a first stage and an Nth final stage, each TGM circuit having first and second input terminals, first and second control terminals and an output terminal;

coupling each input variable and its complement, respectively, to the first and second control terminals of a respective stage of the tree structure, seriatim, the most significant input variable (msb) being coupled to the Nth stage of the tree structure, and the least significant input variable (lsb) being coupled to the first stage;

identifying a series of $2^N$ paths through the tree structure, from the final stage input terminals to the first stage output terminal, each path having a corresponding input terminal in the final stage, so that each path corresponds to a unique binary state of the input variables;

designating as a TRUE path each one of the series of paths for which the predetermined boolean function is true;

designating as a FALSE path each one of the series of paths for which the predetermined boolean function is false;

for each TRUE path, coupling a logical true signal to the corresponding input terminal; and for each FALSE path, coupling a logical false signal to the corresponding input terminal;

whereby, in operation of the logic circuit, the logic states of the input variables control the TGM circuits to route a logic signal to the output terminal in accordance with the predetermined boolean function.

2. A method according to claim 1 including reducing the N-stage TGM binary tree structure to form an $N-1$ stage TGM tree structure, said reducing including:

deleting the final stage of the TGM tree structure to form a reduced tree structure comprising $N-1$ stages wherein each output terminal of the deleted final stage defines a corresponding input terminal to the reduced tree structure;

identifying a series of $2^{N-1}$ reduced paths through the reduced tree structure, each reduced path having a corresponding input terminal, so that each reduced path corresponds to a unique state of the input variables other than the most significant input variable (msb);

for each reduced path, defining a corresponding function of the most significant input variable (msb) so that, for each state of the msb, the value of said corresponding function equals the value of the predetermined boolean function of all the input variables; and for each reduced path, coupling the corresponding input terminal to receive a logic signal that is the corresponding function of the msb.

3. A method according to claim 1 including reducing the N-stage TGM binary tree structure to form an $N-2$ stage TGM tree structure, said reducing including:

deleting the Nth and $N-1$ stages of the TGM tree structure to form a reduced tree structure comprising $N-2$ stages, whereby each output terminal of the deleted $N-1$ stage defines a corresponding input terminal to the reduced tree structure;

identifying a series of $2^{N-2}$ reduced paths through the reduced tree structure, each reduced path having a corresponding input terminal, so that each reduced path corresponds to a unique state of the input variables other than the two most significant input variables;

for each reduced path, defining a corresponding function of the two most significant input variables (msb and msb-1) so that, for each state of msb and msb-1, the value of said corresponding function equals the value of the predetermined boolean function of all the input variables; and for each reduced path, coupling the corresponding input terminal to receive a logic signal that is the corresponding function of the msb and msb$-1$.

4. A method according to claim 1 wherein at least one of the TGM circuit includes a pair of transmission gates, at least one of which consists of an N-channel transistor pass gate.

5. A method according to claim 1 wherein at least one of the TGM circuits includes a pair of transmission gates, at least one of which consists of a P-channel transistor pass gate.

6. A method according to claim 1 wherein at least one of the TGM circuits includes a pair of transmission gates, at least one of which consists of a CMOS transmission gate.

7. A method according to claim 1 wherein at least one of the TGM circuits includes a pair of transmission gates, at least one of which consists of a gallium arsenide MESFET pass gate.

8. A method of constructing a transmission gate logic circuit to provide a predetermined boolean function of N input variables, the circuit including a K-stage transmission gate multiplexer (TGM) tree structure, where K is less than N by an integer number M, comprising:

assigning to each input variable a respective binary weight, so that the N input variables define a series of bits (MSB : MSB$-1$: MSB$-2$... LSB) in order of binary significance;

defining an K-stage TGM tree structure formed of TGM circuits and including a first stage and a final stage, each stage having first and second control terminals and the final stage including a series of input terminals;

coupling each of the K least significant input variables and their complements, respectively, to the first and second control terminals of respective stages of the tree structure in order of binary significance, the least significant input variable being coupled to control the first stage, so that each final stage input terminal corresponds to a unique state of the K least significant input variables;

for each state of the K least significant input variables, expressing the predetermined boolean function as a corresponding function of the M most significant input variables; and for each possible state of the K least significant input variables, coupling the corresponding final stage input terminal to receive a respective logic signal defined by the corresponding function of the M most significant input variables.

9. A method according to claim 8 wherein expressing the predetermined boolean function as a corresponding function of the M most significant input variables includes:

defining a series of $2^K$ binary weighted inputs $W_i$ each corresponding to a unique state of the input variables, where i {0 through $2^K-1$};

for each binary weighted input $W_i$, determining a corresponding logic value, true or false, according to the predetermined function of the corresponding state of the input variables;

forming a table having a series of rows and a series of columns, each row corresponding to a respective state of the M most significant input variables, MSB through MSB-(M$-1$), for a total of $2^M$ rows;

arranging the binary weighted inputs to form $2^K$ columns in the table, the first $2^K$ binary weighted inputs arranged along the first row, the second $2^K$ binary weighted inputs arranged along the second row, and so on, so that the table has the following form:

| M VARIABLES | | | | K VARIABLES |
|---|---|---|---|---|
| M | W0' | W1' | ... | W(2 (K) − 1) |
| IM' ... I2'I1'I0' | W0 | W1 | ... | W(2 (K) −1) |
| IM' ... I2'I1'I0 | W(2 K) | W(2 K) + 1 | ... | W(2 (K + 1) − 1) |
| ... ... ... | ... | ... | ... | ... |
| IM ... I2 I1 I0 | W[(2 N) − 1]*[2 (K)] | | ... | W(2 M) − 1 | within each row of the table, substituting the input expression corresponding to such row in place of each binary weighted input having a logic value of TRUE;

throughout the table, substituting a zero in place of each binary weighted input having a logic value of FALSE;

within each column of the table, logic-OR-ing together the substituted input expressions and zeros to form a corresponding reduced tree input expression;

coupling to each of the inputs to the tree structure a respective logic signal defined by the corresponding reduced tree input expression.

10. A method of constructing a transmission gate logic circuit for providing a predetermined boolean function of N input variables, comprising:

defining an N-stage transmission gate multiplexer (TGM) binary tree structure having $2^N$ input terminals and an output terminal, each stage of the tree structure having a corresponding control input terminal;

coupling each input variable to a corresponding one of the control input terminals according to binary significance, the most significant input variable (msb) being coupled to the Nth stage of the tree structure, and the least significant input variable (lsb) being coupled to the first stage;

identifying a series of $2^N$ paths through the tree structure, each path extending from a respective one of the input terminals to the output terminal, so that each path corresponds to a unique state of the input variables;

designating as a TRUE path each one of the series of paths for which the predetermined boolean function is true for the corresponding state of the input variables;

designating as a FALSE path each one of the series of paths for which the predetermined boolean function is false for the corresponding state of the input variables;

for each TRUE path, coupling a logical true signal to the corresponding input terminal; and for each FALSE path, coupling a logical false signal to the corresponding input terminal.

11. A method of constructing a transmission gate logic circuit for providing a predetermined boolean function of N input variables, comprising:

defining an N-stage transmission gate multiplexer (TGM) binary tree structure having $2^N$ input terminals and an output terminal, each stage of the tree structure having a corresponding control input terminal;

coupling each input variable to a corresponding one of the control input terminals in order of binary significance, the most significant input variable (msb) being coupled to the Nth stage of the tree structure, and the least significant input variable (lsb) being coupled to the first stage;

identifying a series of $2^N$ paths through the tree structure, each path extending from a respective one of the input terminals to the output terminal, so that each path corresponds to a unique state of the input variables;

in each path for which the predetermined boolean function is true for the corresponding state of the input variables, coupling a logical true signal to the corresponding input terminal; and in each path for which the predetermined boolean function is false for the corresponding state of the input variables; coupling a logical false signal to the corresponding input terminal.

12. A method of constructing a transmission gate logic circuit for providing a predetermined boolean function of more than two binary input variables, the method comprising:

providing a plurality of transmission gate multiplexers interconnected so as to form a TGM binary tree structure including a first stage and a second stage, each stage having a pair of complementary control terminals and each TGM including a pair of input terminals and an output terminal, the first stage TGM output terminal defining a Z output terminal;

coupling a first one of the input variables (lsb) and its complement signal to the respective first stage control terminals;

coupling a second one of the input variables (lsb+1) and its complement to the respective second stage control terminals; and for each second stage TGM input terminal, selecting a corresponding binary input signal from a group of input signals that includes at least two different input signals selected from among a logic HIGH, a logic LOW, a third one of the input variables and the complement of the third one of the input variables in accordance with the predetermined boolean function; and coupling each second stage TGM input terminal to receive the corresponding selected input signal.

13. A method according to claim 12 wherein at least one of the TGM circuits includes a pair of transmission gates, at least one of which consists of an N-channel transistor pass gate.

14. A method according to claim 12 wherein at least one of the TGM circuits includes a pair of transmission gates, at least one of which consists of a P-channel transistor pass gate.

15. A method according to claim 12 wherein at least one of the TGM circuits includes a pair of transmission gates, at least one of which consists of a CMOS transmission gate.

16. A method according to claim 12 wherein at least one of the TGM circuits includes a pair of transmission gates, at least one of which consists of a gallium arsenide MESFET pass gate.

* * * * *